United States Patent [19]

Proctor

[11] 4,031,432

[45] June 21, 1977

[54] SOLID STATE SWITCHING CIRCUIT AND METHOD FOR SIMULATING A RELAY

[75] Inventor: Daryl F. Proctor, Redmond, Wash.

[73] Assignee: Proctor and Associates Company, Redmond, Wash.

[22] Filed: Nov. 5, 1975

[21] Appl. No.: 629,127

[52] U.S. Cl. .................................... 361/7; 323/23; 361/100

[51] Int. Cl.² ...................................... H02H 7/20

[58] Field of Search .............. 317/31, 33 R, 33 SC, 317/124, 135; 323/22 T, 23, 25; 307/117, 125, 130, 133, 240–244; 330/13, 18

[56] References Cited

UNITED STATES PATENTS

| | | | |
|---|---|---|---|
| 3,530,338 | 9/1970 | Knabe | 317/31 X |
| 3,670,234 | 6/1972 | Joyce | 317/31 X |
| 3,706,925 | 12/1972 | Engelhardt | 323/22 T |
| 3,767,978 | 10/1973 | Wernli | 317/124 |

OTHER PUBLICATIONS

"Semiconductor Devices and Circuits", Alley and Atwood, John Wiley & Sons Inc., 1971 pp. 423, 424.

Primary Examiner—Donovan F. Duggan
Assistant Examiner—Patrick R. Salce
Attorney, Agent, or Firm—Christensen, O'Connor, Garrison & Havelka

[57] ABSTRACT

A switching control signal switches a pair of emitter coupled transistors via a drive circuit jointly connected to the base electrodes of the transistors so as to drive the base-to-emitter junctions between an "on" condition in which both base-to-emitter junctions are forward biased and an "off" condition in which both base-to-emitter junctions are reverse biased. In the "on" condition, the collectors of the transistors simulate closed relay contacts capable of conducting substantial current flow and in the "off" condition the collectors simulate open relay contacts capable of accomodating substantial standoff voltages. The drive circuit which controls the "on" and "off" conditions of the transistors includes separate turn "on" and turn "off" circuit paths for producing fast and uniform switching characteristics at the collectors. An electro-optical isolator circuit couples the source of the switching control signal to the drive circuit so as to maintain isolation between the switching control signal and the current or voltage switched by the transistors. Overload protection circuitry automatically turns the transistors "off" in the event of an overload condition and a Zener diode bridge network connected across the collectors of the transistor pair serves to protect the transistors from excessive voltages inadvertently applied to the collectors.

16 Claims, 4 Drawing Figures

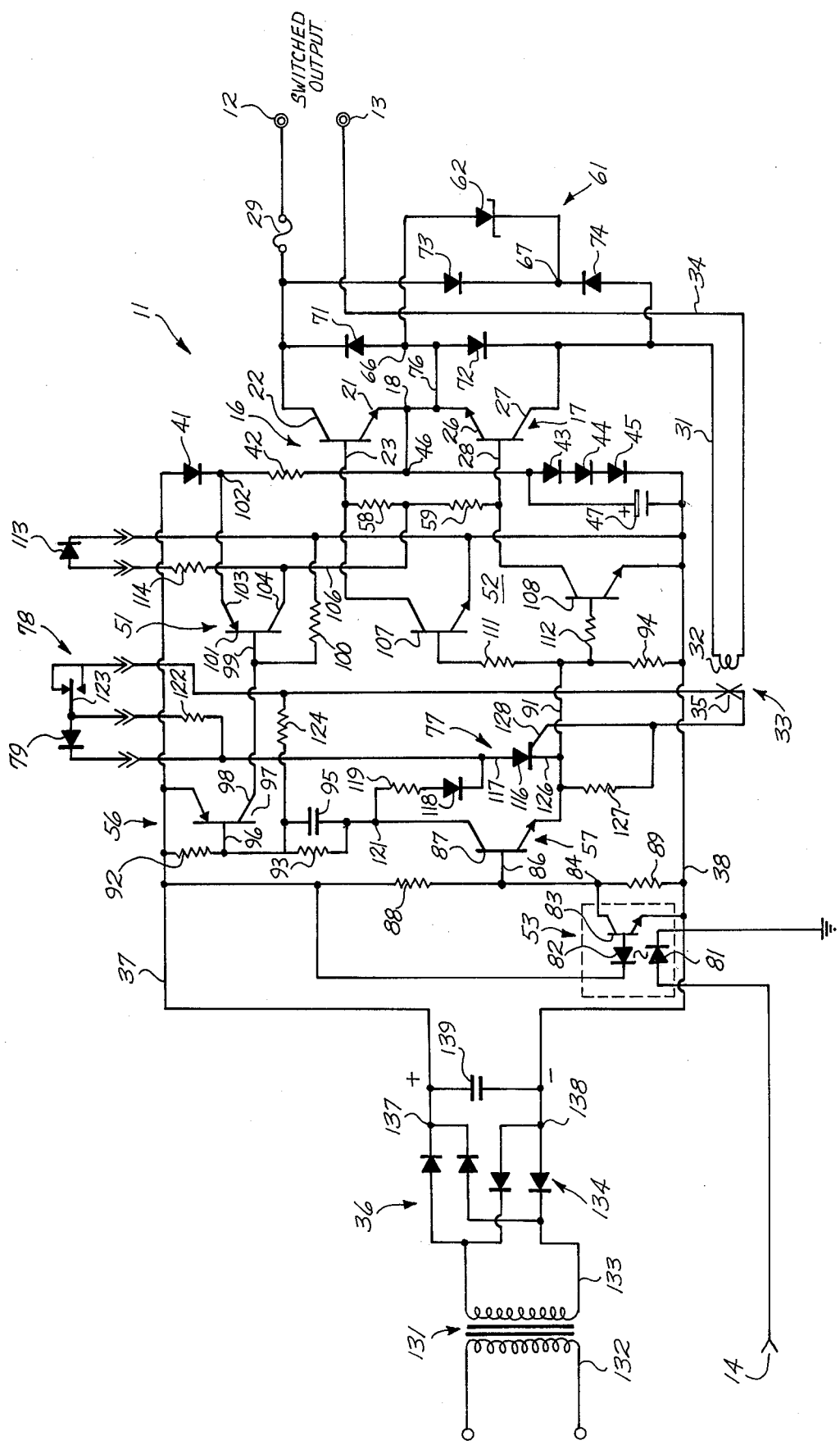

SOLID STATE SWITCHING CIRCUIT AND METHOD FOR SIMULATING A RELAY

BACKGROUND OF THE INVENTION

The present invention relates to solid state circuitry for switching relatively high currents in response to a control signal.

In numerous electrical systems, the conventional, electro-mechanical relay still provides useful characteristics which are not readily obtainable in solid state circuitry. For example, conventional relays have the advantage of providing complete electrical isolation between the control signal, that is the signal applied to the relay coil, and the external circuit controlled by the opening and closing of the relay contacts. In contrast, most solid state switching devices and circuits exhibit electrical coupling of the control and controlled circuits such that it is necessary to resort to the older, more conventional switching devices, namely relays, when it is desirable to maintain isolation between the control signal and the switched circuitry.

Furthermore, relays are typically capable of handling substantial current flow between the contacts, whereas solid state circuits capable of achieving the same current switching capabilities generally require expensive and sophisticated devices.

Other situations arise where solid state circuitry might be employed; however, difficulties arise in adapting the solid state switching components to a system which has been designed for use with relays. In such case, the existing system may be incapable of operating satisfactorily without providing the same characteristic switching parameters including isolation between the input control signal and the output or controlled circuit as is available from a relay.

Notwithstanding the continued utility of relay switching devices, it is recognized that relays exhibit certain disadvantages in their switching characteristics. Among these disadvantages are contact bounce, unpredictable switching times, relatively slow switching times compared to solid state devices, arcing between the contacts during opening, especially in the presence of highly inductive loads, and limited standoff voltage capability. Although various types of remedial circuitry has been devised for ameliorating the effects of these disadvantageous characteristics, the relay, in general is incapable of matching the switching speeds and predictability of turn on and turn off times exhibited by solid state switching devices.

In view of the foregoing, numerous attempts have heretofore been made to adapt solid state circuits for use as replacements or substitutes for conventional relays. For example, a single switching transistor may be combined with various current directing diode networks connected across the switched output terminals of the transistor in an effort to simulate the bidirectional current flow capabilities of a pair of relay contacts. However, such circuits have not always been found satisfactory. In another example, solid state triac devices have been employed as voltage controlled switches; however, these also have been found lacking in certain characteristics, such as the undesirably large voltage drop across the switched terminals when the device is driven to a conducting "on" condition.

SUMMARY OF THE PREFERRED EMBODIMENT OF THE INVENTION AND ITS OBJECTIVES

Accordingly, it is an object of the present invention to provide a solid state switching circuit having output terminals which electrically simulate isolated electromagnetic relay contacts while at the same time retaining the advantages of solid state switching characteristics.

It is another object of the present invention to provide such a solid state switching circuit having relatively rapid, predictable turn "on" and turn "off" switching characteristics.

Still a further object of the present invention is to provide such a solid state switching circuit having overload protection features for automatically protecting the switching circuit from current and/or voltage overloads.

Briefly, these objects are achieved by a solid state switching circuit in which a pair of like polarity transistors are arranged with their emitters connected together and with their collectors adapted to serve as output terminals for connection to an external circuit to be switched. A switching control signal is received through an isolation circuit, herein provided by an electro-optical isolator, and is applied to the base emitter junctions of the pair of transistors through a drive circuit including separate transistor networks for first turning the transistor pair "on" by forward biasing the base-to-emitter junctions, and thereafter turning the transistor pair "off" by abruptly reverse biasing the base-to-emitter junctions. The switching control signal occurs irregular or non-periodic at times, such as a supervisory signal in a telephone system, and corresponds to the control signal applied to the coil of a relay. When the pair of transistors are turned "on", the collector terminals thereof exhibit a low impedance state representing a closed contact relay condition, and when the transistors are turned "off", the same collector output terminals assume a relatively high impedance state representing an open contact condition.

In order to protect the circuitry from current overloads at the switched output terminals, excessive current flow thereat is sensed by an electro-magnetic circuit, which in turn triggers a solid state disabling circuit for activating the turn "off" transistor network of the drive circuitry. This serves to immediately drive the pair of transistors to an "open" condition in the event of a current overload. For protecting the switching transistors from excessive voltages at the collector output terminals, a diode bridge network having voltage-limiting Zener diodes connected therein, serves to limit the voltage swing at the output terminals to a predetermined maximum.

These and further features, objects and advantages of the particular embodiment of the invention disclosed herein will become apparent to those skilled in the art from a consideration of the following detailed description and appended drawings.

BRIEF DESCRIPTION OF THE DRAWINGS

The drawing appended hereto is a schematic diagram of the herein disclosed preferred embodiment of the solid state switching circuit for simulating a relay in accordance with the present invention.

DESCRIPTION OF PREFERRED EMBODIMENT

With reference to the drawing, the particular embodiment of the invention illustrated herein includes a solid state switching circuit 11 having a pair of output terminals 12 and 13 simulating a pair of relay contacts responsive to a control signal applied at input 14. Terminals 12 and 13 normally assume a relatively high impedance thereacross, representing an "open" switch condition, corresponding to open relay contacts. A pair of emitter coupled transistors 16 and 17 serially connected between terminals 12 and 13 are responsinve to a control or switching signal applied at a control input 14 to cause the output terminals to assume a relatively low impedance or "closed" switch condition.

As more fully disclosed herein, control input 14 is connected through an electro-optical isolator means to and for controlling the switching transistors 16 and 17 to avoid any direct electrical connection between the control signal at input 14 and the switched circuit at terminals 12 and 13, thus simulating the isolation available in a relay between the control signal applied to the relay coil and the external, switched circuit connected to the relay contacts. Accordingly, switched output terminals 12 and 13 are adapted for connection to an independent, external circuit which is to be switched at terminals 12 and 13 in the same manner that an external circuit connected to a pair of relay contacts is switched by an independent control signal applied to the relay coil.

The "on"-"off" switch condition at terminals 12 and 13 is provided by a pair of like polarity transistors 16 and 17, here of the NPN type, arranged in serially connected emitter coupled back-to-back configuration. More particularly the emitters are coupled at connection 18 and the collectors are individually extended to separate one of the output terminals 12 and 13. Transistor 16 includes an emitter 21, a collector 22 and a base 23, while transistor 17 similarly includes an emitter 26, a collector 27 and a base 28. Accordingly, emitters 21 and 26 of the transistor pair are coupled at connection 18, while collector 22 of transistor 16 is connected through a fuse 29 to output terminals 12 and collector 27 of transistor 17 is connected over line 31, through a coil 32 of an overload sensing reed relay 33 and from there over connecting line 34 to the other output terminal 13. In this manner, the pair of emitter coupled transistors 16 and 17 are connected with their collector-emitter paths in series across output terminals 12 and 13.

With the collector-emitter paths of the pair of transistors 16 and 17 thus symmetrically arranged with respect to the output terminals 12 and 13, the transistors are jointly, selectively operated by drive circuit means responsive to the switching signal at control input 14 to assume either a high impedance or a low impedance state, corresponding to "open" and "closed" conditions respectively, at terminals 12 and 13. For this purpose, the drive circuit means includes a power supply 36 establishing in this instance a plus voltage reference line 37 and a minus voltage reference line 38. The voltage difference between these lines provides bias voltage for the base-emitter circuits of switching transistors 16 and 17 and provides operating power for the remaining solid state of the drive circuitry.

More particularly, circuit means are provided between lines 37 and 38 for establishing an emitter reference voltage at the common connection 18 between emitters 21 and 26. Here, this reference voltage is derived from a voltage divider circuit connected between positive and negative reference lines 37 and 38 and including a diode 41, a resistor 42 and a set of serially connected diodes 43, 44 and 45. The emitter reference voltage is provided at a junction 46 between resistor 42 and diode 43, wherein the potential junction 46 is raised above the negative reference voltage line 38 by an amount equal to the summation of the forward voltage drops across diodes 43 through 45. A filtering capacitor 47 connected in parallel across diodes 43 through 45 serves to smooth the biasing voltage developed at junction 46 and applied to the common emitter connection 18. Having established the emitter reference voltage, the transistors 16 and 17 are operated by applying an appropriate drive voltage or current to the bases 23 and 28 to selectively forward or reverse bias the base-to-emitter transistor junctions.

Accordingly, a base switching circuit means is connected to the bases 23 and 28 and is here provided by a "turn-on" transistor network 51 including transistor 101, and a "turn-off" transistor network 52 including transistors 107 and 108. These networks 51 and 52 are activated by the signal condition at control input 14 through a switching signal source means including electro-optical isolator 53 and intermediate amplifying transistor networks 56 and 57. Briefly, in operation, transistors 16 and 17 are normally in a turned "off" condition with the bases 23 and 28 at a voltage potential less than the emitter reference voltage, thus reverse biasing the base-to-emitter junctions, substantially blocking any conduction between terminals 12 and 13. In response to a control signal applied through electro-optical isolator 53, "turn-on" network 51 applies positive drive currents to the bases 23 and 28 through a pair of base drive resistors 58 and 59 driving the transistors 16 and 17 "hard" on and into a saturated forward biased state. In this condition, the collector emitter paths of the transistor pair are capable of conducting currents associated with an external circuit (not shown) connected at terminals 12 and 13, wherein such currents may flow in either direction through the transistors. While one of the transistors will conduct current in the usual, forward bias direction, the remaining transistor of pair 16 and 17 must assume a reverse current mode in which the current flows against the normal direction. It is believed that this phenomenon is due to the basic symmetry of junction transistors, in which the emitter and collector junctions may in fact be interchanged depending upon the voltages applied to the transistor electrodes.

Although the configuration of back-to-back transistors has been utilized in symmetrical chopper circuits for cancelling offset voltages as shown and described in "Semiconductor Devices and Circuits" by Charles L. Alley and Kenneth W. Atwood, John Wiley and Sons, 1971, at pages 423 and 424, the present circuit is based on several heretofore unrecognized characteristics of the symmetrically arranged, emitter coupled back-to-back transistors. One of these characteristics is a surprisingly low voltage drop across the pair of transistors during the turned "on" condition. For example, it has been found that the combined voltage drop is: 0.12 to 0.15 volts (at 1 ampere); and approximately 0.03 volts (at 100 milliamperes) in the presently disclosed circuit when the transistors are driven to their low impedance "on" state and the indicated currents are flowing through the transistors' collector-emitter paths. Secondly, the pair of transistors connected in this manner demonstrate a relatively high voltage standoff capability, wherein voltages as high as 1200 volts may be placed across output terminals 12 and 13 of the present circuit causing only nanoamperes of leakage when the transistors are driven to an "off" condition. Still another characteristic of this arrangement is its ability to handle substantial current flow at terminals 12 and 13. By an appropriate selection of the collector-emitter current handling capabilities of the transistors 16 and 17, currents of 1 ampere or more at terminals 12 and 13 may be readily handled.

These unexpected characteristics render this configuration of transistors 16 and 17 as illustrated, extremely useful as a solid state switch, wherein the collector electrodes, namely collectors 22 and 27 are extended to output terminals 12 and 13, adapted for connection to the external circuit which is to be switched on command by a control signal applied at input 14.

It has been found that the precise characteristics of transistors 16 and 17 are not critical. As an example of particular transistors which may be used, the present circuit employs a pair of power transistors sold by Texas Instruments, Inc., Dallas, Tex., under the designation T1P553. These transistors are readily capable of conducting the 1 ampers current flow, and holding off 1200 volts as mentioned above.

In order to protect the components of circuit 11 in the event of overload conditions, several protective circuits are provided in combination with the transistors 16 and 17 and in combination with the drive circuit networks 51, 52, 56 and 67. A first of these protective circuits takes the form of a diode bridge network 61 connected across the collectors of transistors 16 and 17 and including at least one Zener diode 62 connected across the diode bridge between intermediate junctions 66 and 67. Network 61 defines a full wave diode bridge composed of diodes 71 and 72 connected between junction 66 and collectors 22 and 27 of the switching transistors, respectively, and diodes 73 and 74 connected between junction 67 and collectors 22 and 27, respectively. Junction 66 is also connected to the emitter reference voltage at common connection 18 over jumper line 76. In this manner, the voltage across output terminals 12 and 13 is limited by the breakdown voltage of the Zener diode 62 connected across the bridge junctions 66 and 67. By virtue of the bridge diodes 71–74, Zener diode 62 is capable of limiting excessive voltage swings of either polarity. In this particular example, the breakdown voltage for Zener diode 62 is in the range of 1200 volts, approximating the holdoff or standoff voltage capabilities of the emitter coupled transistors 16 and 17. Alternatively, several Zener diodes may be serially connected between junctions 66 and 67 to achieve this breakdown voltage. In general, network 61 including the Zener diode serves to limit transient voltage spikes that exceed the predetermined maximum voltage capability of the transistors.

Additionally, it is desirable to provide protection for excessive current flow through the transistors due to a malfunction or improper connection of the external circuit to terminals 12 and 13. For this purpose, a reed delay 32 is provided with its coil 32 connected in series with the collector-emitter paths of transistors 16 and 17 between terminals 12 and 13. The appearance of an excessive current flow through the transistors results in the actuation of the reed relay contacts 35 which, in turn, trigger an SCR switching circuit 77. When so triggered, SCR switching circuit 77 immediately activates the transistor "turn-off" network 52 applying an abrupt reverse bias to the base-emitter junctions of transistors 16 and 17 and driving them to their high impedance "open" switch condition. The disablement or open breaker condition provided by the triggering of SCR switching circuit 77 continues, even though the control signal at input 14 is removed, until circuit 77 is reset by manually operating a reset switch 78 in a manner more fully described herein. This reset feature, prevents repeated closing of the output terminals 12 and 13 by a switching signal at control input 14, until the problem creating the excessive current has been located and remedied. In other words, merely removing an "on" signal at control input 14 does not restore the breaker circuit; such restoration requires the affirmative act of resetting manually operated reset switch 78. An LED (light emitting diode) 79 may be provided in association with SCR switching circuit 77 and reset switch 78 to indicate that the breaker has been triggered.

In the operation of circuit 11, a switching signal is received at control input 14, energizing a light emitting diode 81 of electro-optical isolator 53. In response thereto, a photo-sensitive diode 82 drives a base electrode of transistor 83, turning on transistor 83 so as to clamp the voltage at a junction 84 to the negative reference voltage line 38.

This input through isolator 53 turns "off" a normally "on" intermediate transistor amplifier network 57. Network 57 is normally maintained in an "on" or conducting condition in which a base electrode 86 of transistor 87 is normally held at a relatively elevated potential from negative reference voltage line 38 by a voltage divider formed of resistors 88 and 89. These voltage divider resistors 88 and 89 are connected across the positive and negative reference voltage lines 37 and 38 and define an intermediate voltage junction 84 connected to base electrode 86 of transistor 87 and to the collector of electro-optical isolator transistor 83. Thus, transistor 87, which here is of the NPN type, is held normally "on" by the elevated voltage at junction 84 between resistors 88 and 89, and is responsive to the switching signal source received through isolator 53 to assume an "off" condition, caused by the drop in voltage at junction 84 and thus at base electrode 86 of transistor 87 when transistor 83 is turned "on".

Transistor 87 of intermediate transistor amplifier network 57 jointly operates the transistor "turn-on" network 51 through amplifier network 56, and the "turn-off" transistor network 52 over an emitter coupled connecting line 91. More particularly, the collector-emitter path of transistor 87 forms a voltage divider network with a resistor 92, resistor 93 and paralleled capacitor 95, and a resistor 94 connected between the positive and negative reference voltage lines 37 and 38.

In general the switching of transistor 87 between its normally "on" condition to its "off" state, enables the "turn-on" network 51, through intermediate network 56, to drive transistors 16 and 17 "on", and results in the disabling of "turn-off" network 52 to free the base electrodes of transistors 16 and 17 for operation by network 51.

This occurs in the following manner. As transistor 87 is switched from its normally "on", conducting condition to its "off", nonconductive condition, the voltage on interconnecting line 91 decreases, switching the transistors of network 52 to their high impedance condition and allowing the bases 23 and 28 of transistors 16 and 17 to be driven by "turn-on" network 51. Simultaneously, the voltage at base electrode 96 of an intermediate amplification transistor 97, here a PNP type, of network 56, switches this transistor from a normally "on", conducting condition to an "off" or nonconducting condition. The collector 98 of transistor 97 is connected to and for driving the base electrode 99 of a transistor 101, here also a PNP type. Transistor 101 provides the active switching element of transistor "turn-on" network 51. Accordingly, as the voltage on collector 98 drops in response to the turning "off" of transistor 97, the base 99 of transistor 101 similarly drops, turning transistor 101 "on". A biasing resistor 100 is connected between base electrode 99 of transistor 101 and the negative reference voltage line 38.

By turning transistor 101 to its "on", conducting state, positive base current is injected into the base electrodes of transistors 16 and 17 from junction 102, through the emitter 103 and collector 104 of transistor 101, over a conducting line 106 and jointly through a pair of separate base drive resistors 58 and 59 connected to bases 23 and 28. The voltage and resistance values may be selected together with the characteristics of transistors 16 and 17 in order to drive these transistors into a saturated, "on" condition. As aforementioned, bidirectional current conduction through transistors 16 and 17 and output terminals 12 and 13 is now possible, and the switch is in its closed, low impedance condition, which is maintained so long as the switching signal is applied to control input 14.

Removal of the switching signal at control input 14 preferably causes an abrupt termination of the conduction through transistors 16 and 17. For this purpose, "turn-off" network 52 here is provided by a pair of transistors 107 and 108 having their collector-emitter paths connected so as to abruptly clamp the bases 23 and 28 of the switching transistors to the negative reference voltage line 38, reversing biasing the base-to-emitter junctions of transistors 16 and 17, thus accelerating the turn off time.

More particularly, the removal of a switching signal at control input 14 causes transistor 87 of network 57 to revert to its normally "on" condition, abruptly switching the voltage on line 91 toward a more positive value, and thus turning on transistors 107 and 108 through a pair of base drive resistors 111 and 112. The collector-emitter paths of these two transistors abruptly assume a low impedance condition, reverse biasing the base-to-emitter junction as described above, and terminating the conduction through the pair of transistors 16 and 17. The use of a separate "turn-off" network enhances the sharpness of the turnoff time of the switch, which otherwise would fall off more slowly if responsive merely to the termination of conduction through "turn-on" network 51.

To display the conducting state of transistors 16 and 17 at any instant, an LED 113 may be connected in series with a resistor 114 across a suitable voltage difference responsive to the switching condition of the circuitry, here provided by the collector 104 of transistor 101 and the negative reference voltage line 38.

As mentioned SCR switching circuit 77 provides an over-load breaker function and includes an SCR 116 having its annode 117 connected to receive positive voltage from reference line 37 as available at junction 121 through a first network including serially connected diode 118 and resistor 119. Additionally, anode 117 is coupled to positive reference voltage line 37 through a second network including reset switch 78 and manually operated, momentary contacts 123 thereof, LED 79 and shunt resistor 122, a resistor 124 connected to the voltage divider junction between resistor 92 and parallel connected resistor 93 and capacitor 95.

A cathode 126 of SCR 116 is connected to line 91 between the emitter of transistor 87 and resistor 94. A gate biasing resistor 127 is connected from line 91 to a gate electrode 128 of SCR 116, and the normally open contacts 35 of reed relay 33 are connected between resistor 124 and gate electrode 128 in order to apply a trigger voltage to the gate electrode to the gate electrode in response to an excessive current flow detected by coil 32.

Thus, in operation, SCR switching circuit 77 is responsive to a momentary closure of reed relay contacts 35 to apply a positive trigger voltage to gate electrode 128 of SCR 116, wherein the positive trigger voltage is derived from positive voltage reference line 37 through resistors 92 and 124. Responsively, SCR 116 switches to a conducting, low impedance state between its anode 117 and its cathode 126. The voltage on line 91 rises sharply towards the positive reference voltage line 37, and switches the "turn-off" transistors 107 and 108 of network 52 "on", reverse biasing the base-to-emitter junctions of transistors 16 and 17 and turning these transistors "off". The anode current for SCR 116 is available through resistor 119 and diode 118 so long as junction 121 remains relatively positive, corresponding to a condition in which transistor 87 is nonconducting. If, the switching signal and control input 14 is removed after SCR switching circuit 77 has been activated, then transistor 87 is turned "on", dropping the voltage at junction 121, and requiring the anode to cathode current for SCR 116 to flow through reset switch 78 and contacts 123 thereof, from resistor 124. After the cause of the malfunction which has resulted in excessive current flow at terminals 12 and 13 has been corrected, then the breaker operation provided by SCR switching circuit 77 may be reset by momentarily interrupting the current flow through reset switch contacts 123 terminating the conducting state of SCR 116 and enabling the circuit to respond to a signal at control input 14. LED diode 79, which is energized during the conduction of SCR 116, serves to indicate that the breaker circuit has been activated.

Power supply 36 is here provided by a transformer 131 with the primary 132 adapted for connection to a power source of alternating current and with a secondary 133 connected across a full wave, diode rectification bridge 134 having its output terminals 137 and 138 connected to the positive and negative reference voltage lines 37 and 38 respectively. A filter capacitor 139 serves to smooth out the full wave rectified voltage available across terminals 137 and 138.

While only a particular embodiment of the present invention has been disclosed herein, it will be readily apparent to persons skiilled in the art that numerous changes and modifications may be made there to without departing from the spirit of the invention. For example, it will be appreciated that transistors 16 and 17 may be driven solely by the output from "turn-on" network 51 directly in response to a signal at control input 14. In other words, the base electrodes, corresponding to bases 23 and 28 of transistors 16 and 17 may be selectively driven by the output of a single transistor network such as transistor 101, without requiring the use of intermediate amplification transistor networks 56 and 57 and without using a separate turn "off" network 52. Although the combination of networks 52, 56 and 57 with network 51 provides superior results, and is thus preferred, they are not essential to the operation of the pair of switched, emitter coupled transistors 16 and 17.

Thus, it will be seen that the foregoing disclosure is for illustrative purposes only and does not in any way limit the invention which is defined only the following claims.

I claim:

1. A solid state switch comprising:
a pair of output terminals adapted to be connected in a circuit path which is to be switched between closed and open conditions;
a pair of like polarity transistors having their emitters connected in common and having their collectors individually connected to a separate one of said output terminals;
switching signal source means having an output producing a switching signal at selected, non-periodic times; and
drive circuit means jointly connected to said emitters and to the bases of said pair of transistors, and said drive circuit means being connected and responsive to said output of said switching signal source means to drive the base emitter junctions of said pair of transistors between a forward biased condition in which said pair of output terminals connected to said collectors assume a relatively low impedance closed switch condition and a reverse biased condition in which said output terminals connected to said collectors assume a relatively high impedance open switch condition.

2. The solid state switch of claim 1, wherein said drive circuit means includes an emitter reference voltage means and a base switching circuit means, said emitter voltage reference means connected to said commonly connected emitters of said pair of transistors for establishing an emitter reference voltage thereat, said base switching circuit means connected jointly to the bases of said pair of transistors and having a normal, turn-off state in which a reverse bias voltage is applied to said bases with respect to said emitter reference voltage, and having a turn-on state in which a forward bias voltage is applied to said bases with respect to said emitter reference voltage, said base switching means being responsive to said switching signal source means to switch from its normal turn-off state to its turn-off state.

3. The solid state switch set forth in claim 1, wherein said drive circuit means includes a "turn on" transistor network means and a "turn off" transistor network means, said "turn on" transistor network means connected to and for forward biasing said base-to-emitter junctions of said pair of transistors in response to the commencement of said switching signal of said switching signal source means, and said "turn off" transistor network means connected to and for reverse biasing said bases of said pair of transistors in response to the termination of said switching signal.

4. The solid state switch set forth in claim 1, further comprising:

a full wave diode bridge network connected across said pair of output terminals and having a pair of intermediate junctions across which appears a voltage of predetermined polarity and of a magnitude substantially equal to a bipolarity voltage across said output terminals; and
at least one Zener diode connected between said intermediate junctions of said bridge network and having a predetermined threshold voltage of conduction, whereby the voltage across said output terminals, regardless of its polarity, is limited in magnitude by said predetermined threshold voltage level established by said Zener diode.

5. The solid state switch of claim 2, wherein said emitter reference voltage means includes a voltage divider network connected across a difference voltage established by a pair of reference voltage lines, said voltage divider network including a plurality of forwardly biased serially connected diodes connected between said emitters and one of said reference voltage lines, whereby the emitter reference voltage is established by the forward bias voltage drop across said forwardly biased serially connected diodes.

6. The solid state switch of claim 1, wherein said switching signal source means includes an electro-optical isolator having a control input for receiving an electrical control signal at said selected, non-periodic times and providing said output connected to said drive circuit means for producing said switching signal in response to said control signal at said input, whereby said control signal originates from a circuit which is electrically isolated from said drive circuit means and from said pair of transistors.

7. The solid state switch of claim 3, wherein said "turn-off" transistor network means includes a pair of transistors having their collector-emitter paths individually connected between the base of a separate one of said transistors and a reference voltage line having a predetermined base-emitter reverse bias voltage relationship with respect to said emitter reference voltage, and said drive circuit means including circuit means jointly connected to the bases of said separate transistors of said "turn-off" transistor network means for jointly switching such transistors to an "off" non-conducting state in response to said commencement of a said switching signal and to an "on" conducting state in response to said termination of said switching signal, whereby said bases of said pair of like polarity transistors are connected through said "turn-off" network means transistors, when they are in said "on" conducting state, to said reference voltage line for reversing biasing said base-to-emitter junction.

8. The solid state switch of claim 3, wherein said drive circuit means further includes intermediate amplification transistor network means connected between said output of said switching signal source means and said "turn-on" and "turn-off" transistor network means for receiving and amplifying said switching signal and driving said "turn-on" and "turn-off" transistor network means in response thereto.

9. The solid state switch of claim 1, further comprising:
overcurrent sensing relay means having a relay coil serially connected between said pair of transistors and said output terminals and having relay contacts operated by said relay coil; and
circuit breaker means connected to said drive circuit means and to said relay contacts and having a normal unactuated electrical state and being responsive to operation of said contacts by said relay coil to assume an actuated state, said breaker circuit means in said actuated state conditioning said drive circuit means to drive said base-emitter junctions of said pair of transistors to said reverse biased condition, whereby said overcurrent sensing relay means in combination with said breaker current means serves to protect said pair of transistors by driving them to their relatively high-impedance open-switch condition in the event of a overcurrent condition at said output terminals.

10. The solid state switch of claim 9, wherein said breaker circuit means includes an SCR switching device having a non-conducting condition providing said normal, unactuated state and having a conducting condition providing said actuated state, said SCR device including a gate electrode coupled to said contacts of said relay means and being responsive to operation thereof to switch from its non-conducting to its conducting condition.

11. The solid state switch of claim 9, wherein said breaker circuit means further includes a manually operated reset switch means for resetting said breaker circuit means from its actuated state to its normal, unactuated state.

12. A method of operating a pair of emitter coupled transistors of like polarity to selectively switch bidirectional current flow in an external circuit, comprising:
applying said bidirectional current flow through the collector-emitter paths of said transistors by connecting said external circuit across the collectors of said transistors; and
at selected non-periodic times jointly electrically driving the base-emitter junctions of said transistors between a reverse biased state in which said transistors assume a relatively high-impedance open-switch conditon between said collectors interrupting said current flow and a forward biased state in which said transistors assume a relatively low-impedance closed-switch condition between said collectors conducting said bidirectional current flow serially through the collector-emitter paths thereof.

13. The method set forth in claim 12, wherein said step of jointly electrically driving the base emitter junctions of said transistors includes the substep of electro-optically coupling a control signal to and for driving said base-emitter junctions of said transistors, whereby said transistors are operated with respect to a reference potential which is independent of that associated with the control signal by virtue of the electro-optical coupling.

14. The method set forth in claim 12, wherein said step of jointly electrically driving the base-emitter junctions of said transistors includes the substep of establishing an emitter reference voltage at said coupled emitters of said transistors and jointly electrically driving the bases of said transistors between said reverse and forward biased states with respect to the reference voltage established at said coupled emitters.

15. The method of claim 12, wherein said step of jointly electrically driving the base-emitter junctions of said transistors includes the substeps of receiving an electrical control signal for controlling the states of said transistors, coupling said control signal to the base-emitter junctions of said transistors through "turn-on" and "turn-off" transistor networks for mutually exclusively forward biasing and reverse biasing said base-emitter junctions respectively.

16. A solid state switch comprising:
a pair of output terminals to be connected in a circuit path which is to switched between closed and open conditions;
a pair of like polarity transistors having their emitter connected together and having their collectors individually connected to a separate one of said output terminals, said transistors adapted at the bases thereof for being electrically driven between a conducting, closed-switch condition at said output terminals, and a non-conducting, open-switch condition at said output terminals;
a power supply means establishing positive and negative reference voltage lines across which a potential voltage difference exists;
an emitter reference voltage means including a voltage divider network connected between said positive and negative reference voltage lines and having a intermediate voltage junction connected to said emitters and establishing a emitter reference voltage thereat;
a "turn-on" transistor network means including a "turn-on" transistor having its emitter-collector path connected between one of said reference voltage lines and jointly through a pair of base drive resistors to the bases of said pair of transistors and having a normally non-conductive state and being responsive to a signal applied to its base to assume a conducting state applying a forward bias drive signal to said bases of said pair of like polarity transistors;
a "turn-off" transistor network means including a pair of separate "turn-off" transistors having their collector-emitter paths individually connected between a separate one of said bases of said pair of like polarity transistors and one of said reference voltage lines, said separate "turn-off" transistors having normally conducting states applying a reverse bias voltage to the base-emitter junctions of said pair of like polarity transistors and being responsive to a signal jointly applied to the bases thereof to assume non-conducting states releasing the bases of said pair of like polarity transistors to respond to said "turn-on" transistor network means;
switching signal source means having a control input adapted to receive a control signal for determining the condition of conduction of said pair of transistors and having an output producing a switching signal in response to said control input; and
intermediate transistor amplification network means connected between said output of said switching signal source means and said base of said "turn on" transistor and said bases of said "turn-off" transistors for concurrently switching said "turn-on" transistor from its normal non-conducting state to its conducting state and correlatively switching said "turn-off" transistors from their normal conducting state to their non-conducting state in response to said control signal.

* * * * *